United States Patent
Williams, III et al.

(10) Patent No.: US 7,330,079 B2
(45) Date of Patent: Feb. 12, 2008

(54) METHOD AND APPARATUS FOR RAPID LOCAL OSCILLATOR FREQUENCY CALIBRATION

(75) Inventors: Louis Albert Williams, III, Plano, TX (US); Francesco Cavaliere, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/263,304

(22) Filed: Oct. 31, 2005

(65) Prior Publication Data

US 2007/0096840 A1    May 3, 2007

(51) Int. Cl.
*H03L 7/08* (2006.01)
(52) U.S. Cl. .......................................... 331/34; 331/25
(58) Field of Classification Search .................. 331/34, 331/25
See application file for complete search history.

(56) References Cited

U.S. PATENT DOCUMENTS

| | | | |
|---|---|---|---|
| 6,734,741 B2 * | 5/2004 | Staszewski et al. ....... | 331/36 C |
| 2005/0073371 A1 * | 4/2005 | Brett et al. .................... | 331/74 |

OTHER PUBLICATIONS

Riley, T. A. D. et al., "Delta-Sigma Modulation in Fractional-*N* Frequency Synthesis", IEEE Journal of Solid-State Circuits, May 1993, pp. 553-559, vol. 28, No. 5.

Veillette, B. R. et al., "High Frequency Sinusoidal Generation Using Delta-Sigma Modulation Techniques", IEEE, Feb. 1995, pp. 637-640.

* cited by examiner

*Primary Examiner*—Joseph Chang
(74) *Attorney, Agent, or Firm*—Wade J. Brady, III; Frederick J. Telecky, Jr.

(57) ABSTRACT

A controller for an adjustable-frequency oscillator includes a first counter supplied with a stop-count value to count adjustable-frequency oscillator cycles divided by the ratio of desired frequency to reference oscillator frequency, to produce a stop signal when the first counter reaches the stop-count value. A second counter counts cycles of a reference oscillator starting from an initial number related to the stop-count value. The second counter stops counting and produces an end-count when the second counter receives the stop signal from the first counter. A resonant tank circuit includes a bank of capacitors with switches to select resonant tank circuit capacitors. The switches are selectively controlled using the end-count in the second counter. The stop-count value is set for the first counter so that the end count number in the second counter using a ones-complement binary format can be used to iteratively set the switches with minimal digital computation.

14 Claims, 4 Drawing Sheets

METHOD AND APPARATUS FOR RAPID LOCAL OSCILLATOR FREQUENCY CALIBRATION

TECHNICAL FIELD

This invention relates generally to adjustable-frequency oscillators and in particular, to a method and implementation for selecting switched capacitors to adjust the frequency of an adjustable-frequency oscillator.

BACKGROUND

Local oscillators are used in radio-frequency (RF) transmitters and receivers and in other applications to produce an adjustable-carrier or heterodyning frequency. An oscillator with an adjustable frequency enables a transceiver to communicate over a chosen channel. The local oscillator is generally implemented as a voltage-controlled oscillator (VCO) so that its frequency can be adjusted by a variable applied voltage. VCOs are generally implemented with a resonant tank circuit using a fixed inductor and a capacitor that is controlled with a voltage. Varactor diodes can be used to provide a voltage-controlled capacitance, which are back-biased semiconductor diodes wherein their junction depth and internal stored charge in the semiconductor body depend nonlinearly on the applied reverse voltage.

In order to reduce the sensitivity of the frequency of a local oscillator designed as a VCO to noise superimposed on an analog control signal, the VCO tuning range controlled by the analog control signal is constrained to be small. VCOs in communication applications require generation of a precision frequency so that adjacent-channel interference can be avoided. So that the total tuning range of the VCO can be sufficiently wide, which is required in applications wherein operation over a plurality of communication bands is required, the frequency of the VCO is generally controlled by both an analog varactor diode for fine frequency adjustment and a bank of digitally selectable capacitors for wider frequency adjustment. A digital control circuit is needed to select the correct configuration of switched capacitors from a capacitor bank in order to center the VCO frequency around the narrow tuning range of the varactor diode. The control circuit should be compact to obtain low cost, and for frequency hopping applications, it must be able to rapidly tune the capacitor bank, for example in less than 200 µs.

Control circuits of the prior art using digital processes for selection of resonant tank circuit tuning capacitors require extended numerical computation with substantial implementation and manufacturing complexity for their implementation. Digital processes that require extended numerical computation such as multiplication or division of two variables are often implemented with complex digital signal processing techniques or with custom digital circuits with a substantial number of logic gates. Either approach uses significant die area for the circuit, resulting in a costly or otherwise impractical design for a VCO controller targeted at a broad commercial market. In addition, the extensive computation required for capacitor selection adversely affects the time required for a precision change in oscillator frequency. Recognizing that applications of voltage-controlled oscillators include cellular telephones and portable radio transceivers, both of which serve large, competitive markets that include rapid frequency-hopping features, a low-cost VCO controller with a quickly adjustable-frequency would provide a competitive advantage.

The main limitations of the prior art circuits are devices implemented with complex or slow processes to control the frequency of an adjustable-frequency oscillator. The prior art approaches use processes that employ extended arithmetic operations and extensive numerical computation. A need thus exists for an apparatus and method to quickly select capacitors from a capacitor bank to control the frequency of an adjustable-frequency oscillator that can be implemented with relatively simple and low-cost digital logic.

SUMMARY OF THE INVENTION

Embodiments of the present invention achieve technical advantages as a control device to adjust the frequency of an adjustable-frequency oscillator that selectively couples capacitors with switches to a resonant tank circuit coupled to an oscillator to control the resonant frequency of the tank circuit, and thereby the frequency of the oscillator. In a preferred embodiment, the process used in this control device is iterative. First, a varactor diode capacitor, if such a capacitor is used for a fine oscillator frequency adjustment, is set to a midrange capacitance value by applying an appropriate tuning voltage such as a fixed voltage. Second, a preliminary setting, preferably a mid-range capacitance setting, is made of the switched capacitance of capacitors in the bank of capacitors needed to provide the desired oscillator frequency. In a preferred embodiment, the adjustable-frequency oscillator is operated for a set number of cycles, and the control device counts the number of reference clock cycles generated by a reference oscillator for the set number of cycles of the adjustable-frequency oscillator. The resulting reference oscillator cycle count is used to compute a revised setting for the capacitance of the switched capacitors in the bank of capacitors to produce the desired oscillator frequency. The process iterates, if necessary, until the desired oscillator frequency results.

Newton's method is used for numerically solving an equation to compute the revised switched configuration of capacitors in the bank of capacitors needed to provide the desired oscillator frequency. The frequency of the adjustable-frequency oscillator is proportional to the square root of the sum of capacitance of capacitors in the bank of capacitors switched across the resonant tank circuit plus any fixed capacitance coupled across the circuit. In a preferred embodiment, the fixed capacitance, which may be the varactor diode capacitance plus the sum of parasitic and load capacitances, is preferably much greater than the capacitance of one "unit cell" from the bank of capacitors. A unit cell is the smallest increment of capacitance that can be coupled to the resonant tank circuit. Because of the disparity in capacitance between the incremental capacitance needed to correct the frequency of the oscillator and the total capacitance coupled across the resonant tank circuit, the square-root operation can be approximated by a first-order Taylor series, and from this approximation the capacitance change is computed. In a preferred embodiment, the computation is scaled so that the required capacitance expressed in a binary format can be directly used to control the switches coupling the bank of capacitors across the resonant tank circuit. This allows rapid convergence, typically in two iterations or less, and control of the switches for the bank of capacitors with minimal logic and digital computation as described hereinbelow. The voltage of the varactor diode capacitor can then be adjusted in a following process to provide a fine-frequency adjustment with low noise content. The inclusion of a varactor diode capacitor or another capacitor in the resonant tank circuit is an optional element in the circuit. In a preferred embodiment, capacitors in the bank capacitors are selected so that their capacitances form a sequence substantially proportional to the integer-power-of-two sequence {1, 2, 4, 8, . . . }.

The length of the measurement interval for counting cycles of the reference oscillator is determined by counting cycles of the adjustable-frequency oscillator in a manner so that the capacitor adjustment computation is simplified. As explained in more detail hereinbelow, if the number of adjustable-frequency oscillator cycles that is counted is based on the ratio of a capacitor bank unit cell capacitance to the fixed capacitance, and if the cycle counter for the reference oscillator is offset by an amount also dependent on this ratio, the reference count that results at the end of each iteration, expressed in a binary format, is just the number of capacitors in the bank of capacitors to add or subtract, shifted by an integer number of bits. In a preferred embodiment, the binary format is a ones-complement format. In a preferred embodiment, bits computed in a ones-complement format are used to control switches that select capacitors from the bank of capacitors to couple to the resonant tank circuit.

In accordance with a further preferred embodiment of the invention, a control device to adjust the frequency of an adjustable-frequency oscillator selectively couples capacitors to a resonant tank circuit of the adjustable-frequency oscillator to change the resonant frequency of the tank circuit, but the roles of the two oscillators are reversed from the processes described above. In a preferred embodiment, a preliminary setting, preferably a mid-range setting, is made of the switched capacitance of capacitors in the bank of capacitors needed to provide the desired frequency of the adjustable-frequency oscillator. In a preferred embodiment, the reference oscillator is operated for a controlled number of cycles, and the control device counts the number of oscillator cycles generated by the adjustable-frequency oscillator for the set number of cycles of the reference oscillator. The resulting adjustable-frequency oscillator cycle count is used to compute a revised setting for the capacitance of the switched capacitors in the bank of capacitors needed to produce the desired frequency of the adjustable-frequency oscillator. The process iterates, if necessary, until the desired oscillator frequency is produced. The inclusion of a varactor diode capacitor or another capacitor is an optional element in the circuit. In a preferred embodiment, the capacitors in the bank of capacitors are selected so that their capacitances form a sequence substantially proportional to the integer-power-of-two sequence {1, 2, 4, 8, . . . }.

In accordance with another preferred embodiment of the present invention, the capacitors coupled to a resonant tank circuit of the variable frequency oscillator to change the resonant frequency of the tank circuit are formed in at least two banks of capacitors, wherein capacitors in each bank form a sequence of capacitance substantially proportional to the integer-power-of-two sequence {1, 2, 4, 8, . . . }. In a further preferred embodiment, capacitance of capacitors in one bank are substantially larger than capacitances of capacitors in another bank.

Another embodiment of the present invention is a method of controlling the frequency of an adjustable-frequency oscillator, comprising the steps of coupling a first counter to the adjustable-frequency oscillator using a frequency dividing circuit, and counting adjustable-frequency oscillator cycles divided by a frequency-dividing factor of the frequency dividing circuit. In a preferred embodiment the frequency-dividing factor is the ratio of the desired frequency for the adjustable-frequency oscillator to the reference oscillator frequency. In a preferred embodiment, the method includes supplying the first counter with a stop-count value, clearing the count in the first counter, starting the first counter, and when the first counter reaches the stop-count value, producing a stop signal. In a preferred embodiment, the method includes coupling a reference oscillator to a second counter to count reference oscillator cycles and coupling the second counter to the first counter. In a preferred embodiment, the method includes starting the second counter with an initial number at substantially the time when the first counter starts and stopping the second counter when the second counter receives the stop signal from the first counter, producing an end count in the second counter. In a preferred embodiment, the method further includes coupling a resonant tank circuit to the adjustable-frequency oscillator, including a bank of capacitors in the resonant tank circuit with switches that are each coupled to a capacitor in the bank of capacitors, and selectively coupling capacitors in the bank of capacitors to the resonant tank circuit with the switches. In a preferred embodiment, the method further includes coupling a switch selector circuit to the second counter and to the switches in the resonant tank circuit, and controlling the frequency of the adjustable-frequency oscillator with the switch selector circuit by using the end count in the second counter. In a preferred embodiment, the method includes using a crystal-controlled oscillator for the reference oscillator. In a further embodiment, the method includes incrementing a parameter controlling selection of switches in the resonant tank circuit using the end count in the second counter, and representing the parameter in a ones-complement binary format. In a preferred embodiment, the method includes incrementing the parameter controlling selection of switches in an iterative process. In a preferred embodiment, the method includes forming the bank of capacitors using capacitors with capacitance proportional to a unit cell capacitance, and choosing capacitance values for the capacitors in the bank proportional to a series of integer powers of 2. In a preferred embodiment, the method includes selecting an integer N, setting the stop-count value for the first counter to substantially 2.5 less than $2^{N+1}$ divided by the unit cell capacitance as a fraction of the total bank capacitance. In a preferred embodiment, the method includes starting the first counter at the value zero, and using substantially the value stop-count value plus 3 plus $2^{N-1}$ for the initial number in the second counter. In a preferred embodiment, the method includes representing the initial number using ones-complement binary digits. In a preferred embodiment, the method includes selecting the integer N to be equal to 2. In a further embodiment, the method includes using at least two banks of capacitors to provide coarse and fine frequency adjustments for the adjustable-frequency oscillator. In a preferred embodiment, the method includes adjusting the frequency of the adjustable-frequency oscillator using the coarse bank of capacitors before adjusting the frequency using the fine bank of capacitors.

Preferred embodiments incorporating the invention solve the problem of quickly and efficiently selecting capacitors from a bank of capacitors to set the frequency of an adjustable-frequency oscillator to a desired frequency by counting oscillator cycles over a chosen interval of time. The signals to control switches that couple capacitors to a resonant tank circuit for the adjustable-frequency oscillator are determined from the count of oscillator cycles without the need for extended numerical computation.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely an apparatus and method using an input digital signal representing a desired frequency of an adjustable-frequency oscillator to selectively switch capacitors from a bank of capacitors into a resonant tank circuit coupled to the adjustable-frequency oscillator to control the oscillator frequency. Alternative embodiments comprise a computational process to control the frequency of a adjustable-frequency oscillator that avoids the need for numerical multiplication or division of two variables to selectively switch capacitors from the bank of capacitors into a resonant tank circuit. In the illustrated embodiment, a varactor diode capacitor is coupled across a resonant tank circuit to provide an analog adjustment of the oscillator frequency, thus forming a voltage-controlled oscillator.

The simplified adjustable-frequency oscillator frequency tuning process of the invention is an iterative process that typically converges in one or two cycles. In a preferred embodiment, the process produces a time interval substantially inversely proportional to the frequency of the adjustable-frequency oscillator. It measures and scales the time interval using a reference oscillator for a time reference. It increments the number of switched capacitors coupled to the resonant tank circuit of the adjustable-frequency oscillator using the measured and scaled time interval to count cycles of the reference oscillator. If the capacitances of the switched capacitors coupled to the resonant tank circuit of the adjustable-frequency oscillator are chosen to be proportional to a series of integer powers of 2, such as the series {1, 2, 4, 8, . . . }, then ones-complement binary arithmetic can be directly used to control switches that selectively couple the capacitors in the bank of capacitors to the resonant tank circuit. This process results in a simplified numerical process requiring only low-level arithmetic such as a numerical process employing addition, subtraction, bit shifting, or bit selection. The simplicity and speed of the invention accommodate high performance applications with very low cost.

Figure 1:
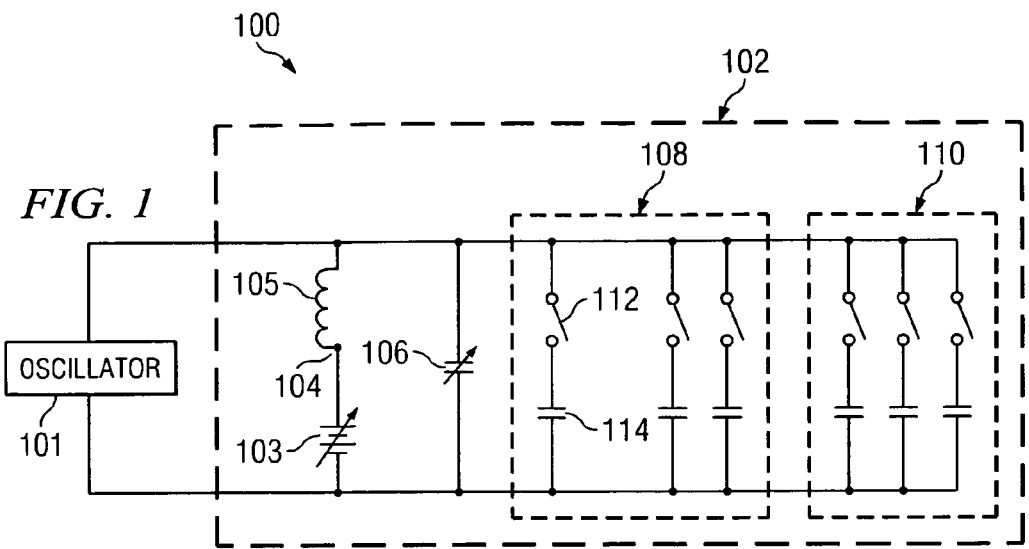
FIG. 1 illustrates an exemplary block diagram of an adjustable-frequency oscillator with a resonant tank circuit coupled to an oscillator.

FIG. 1 illustrates a simplified drawing of a resonant tank circuit 102 coupled to an oscillator 101 to form a VCO 100. The frequency of the VCO is controlled by the resonant frequency of the resonant tank circuit 102, which is controlled by the inductance of the fixed inductor 105 and by the collective capacitance coupled across the inductor. The collective capacitance comprises the capacitance of a varactor diode 106 (represented by a variable capacitor in the figure) and the capacitance of two banks of capacitors, banks 108 and 110. Switches, such as switch 112, selectively couple capacitors from the banks of capacitors, such as capacitor 114, across the resonant tank circuit. The capacitance of the varactor diode is controlled by adjusting the voltage across the varactor diode 106. The varactor diode voltage is controlled by adjusting the voltage at circuit node 104 using the adjustable-voltage source 103, which is coupled to the varactor diode through the inductor 105.

The process of controlling the frequency of a VCO as described in the embodiment below preferably proceeds in a plurality of stages. In a first stage, the capacitance of the varactor diode, if a varactor diode is used in the design, is set preferably to a mid value of capacitance, and the switches selecting capacitors in a bank of capacitors are set preferably to produce a mid value of capacitance for the bank of capacitors. In a second stage, the iterative process is executed to select a switched capacitor configuration for the bank of capacitors to set the frequency of the adjustable-frequency oscillator close to a desired value. If a plurality of capacitor banks is included in the design such as the two capacitor banks illustrated in FIG. 1, then the iterative process is executed again for another capacitor bank to select a switched capacitor configuration for the another bank to set the frequency of the adjustable-frequency oscillator close to a desired value. In a preferred embodiment wherein one capacitor bank produces a coarse frequency adjustment and another capacitor bank produces a fine frequency adjustment, the switched capacitor configuration for the bank of capacitors making the coarse frequency adjustment for the VCO is set before the switched capacitor configuration for the bank of capacitors making the fine frequency adjustment.

Figure 2A:
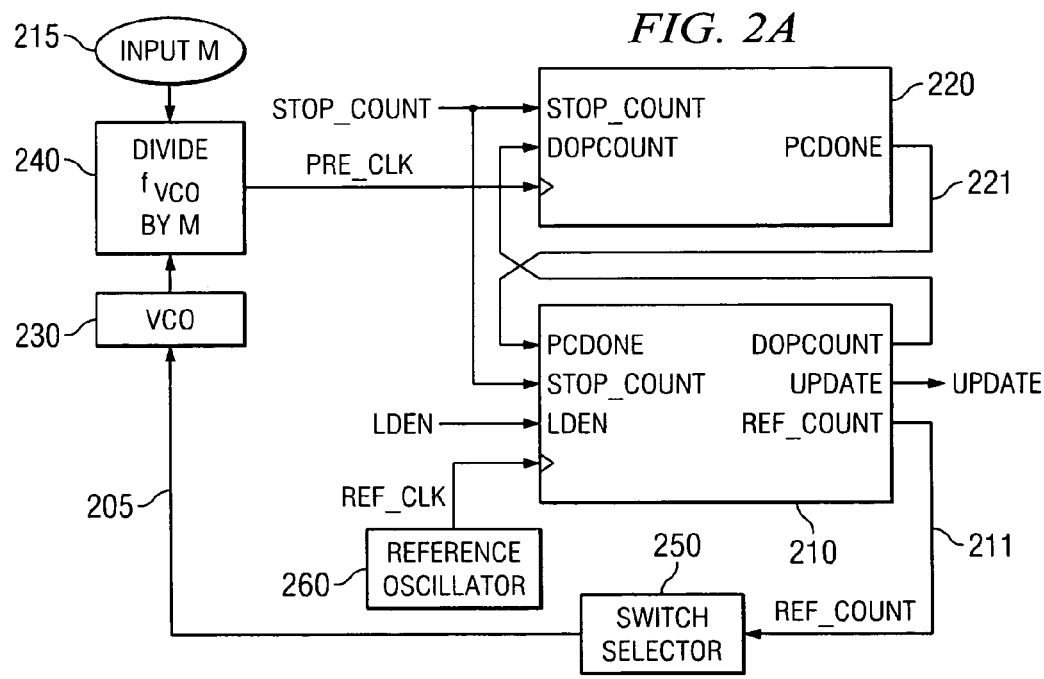
FIG. 2A illustrates a block diagram of the invention showing counters that control a switch selector circuit for an adjustable-frequency oscillator.

The adjustable-frequency oscillator frequency tuning process in an embodiment of the invention is now described in further detail, wherein a frequency of an adjustable-frequency oscillator such as the VCO 230 illustrated in FIG. 2A is controlled by digital signal 205 to form, in effect, a frequency-locked loop. The embodiment as illustrated in FIG. 2A uses two circuits, wherein each circuit uses a frequency counter. In one circuit, circuit 210, a counter is clocked by a reference clock signal, REF_CLK, generated by a reference oscillator 260, preferably a crystal-controlled oscillator, to measure the frequency of the VCO 230. In the other circuit, circuit 220, a counter clocked by signal PRE_CLK from frequency prescaler 240 is coupled to the output of the VCO 230 through the frequency prescaler ("frequency divider") 240 to produce a frequency-divided representation of the VCO frequency $f_{VCO}$ by a dividing factor M.

The dividing factor M is an input 215 to the process that represents the desired oscillator frequency. The dividing factor M is calculated from the equation $$M = \frac{f_d}{f_{REF}}$$

where $f_d$ is the desired VCO frequency and $f_{REF}$ is the frequency of the reference oscillator. For example, if the desired VCO frequency is 1.9 GHz and the frequency of the reference oscillator is 16 MHz, then the value of M is $$\frac{1.9 \text{ GHz}}{16 \text{ MHz}} = 118.75.$$

Division by non-integer values can be performed using a phase-locked loop with a fractional-N divider, as is well known in the art. Such processes are described, for example, in the paper by T. A. D. Riley et al., entitled "Delta-Sigma Modulation in Fractional-N Frequency Synthesis," IEEE Journal of Solid-State Circuits, Vol. 28, No. 5, May 1993, pp. 553-559, and in the paper by B. R. Veillette et al., entitled "High Frequency Sinusoidal Generation Using Delta-Sigma Modulation Techniques," IEEE International Symposium on Circuits and Systems, Vol. 1, Apr. 28, 1995, pp. 637-640, which are hereby referenced and incorporated herein. The frequency prescaler 240 produces a frequency-divided output signal, the signal PRE_CLK. The circuits 210 and 220 are coupled together as illustrated in FIG. 2A.

Figure 2B:
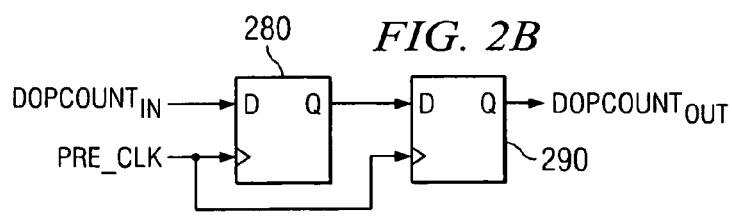
FIG. 2B illustrates exemplary logic for conversion of a signal from the timing domain of the reference oscillator into the timing domain of the adjustable-frequency oscillator.

The VCO frequency tuning process is initiated when the signal LDEN ("lock detect enable", representing enabling the phase-locked loop illustrated in FIG. 2A to operate) is asserted high such as by a status monitoring block (not shown) using a step counter as described hereinbelow. The signal DOPCOUNT ("do prescaler count") goes high on the next REF_CLK edge. The signal DOPCOUNT produced in the circuit 210 is synchronized into the PRE_CLK domain, i.e., into the circuit 220, such as by using a circuit as illustrated in FIG. 2B and as described below. When the synchronized signal DOPCOUNT goes high, a counter in the PRE_CLK domain, in one embodiment a 12-bit counter, begins incrementing, clocked by the signal PRE_CLK. When the count of the counter in the circuit 220 equals the number STOP_COUNT (a value determined as described below, and preferably dependent on the capacitance of the unit cell in the capacitor bank), counting in this counter in circuit 220 halts and the signal PCDONE ("prescaler count done", indicating the prescaler count is complete) is asserted high on line 221 by the circuit 220, thus providing a time interval scaled to the present frequency of the VCO. The total time from the rising edge of the signal DOPCOUNT to the rising edge of the signal PCDONE is $T_{PC}$, which is given approximately by the equation $$T_{PC} = T_{VCO} \cdot M \cdot (\text{STOP\_COUNT} + 2 + \epsilon_p) \quad (1)$$

where $T_{VCO}$ is the VCO oscillator period, M is the nominal prescaler dividing modulus, and $\epsilon_p$ represents uncertainty in the synchronization process, where $0 \leq \epsilon_p \leq 1$. The time interval $T_{PC}$ is thus the length of a time interval substantially scaled to the present frequency of the VCO.

FIG. 2B illustrates, as is well known in the art, the use of two D-flip-flops, 280 and 290, to convert a rising edge signal such as the signal DOPCOUNT$_{IN}$ formed in the reference oscillator time domain into the signal DOPCOUNT$_{OUT}$ for use in the adjustable-frequency oscillator time domain. The circuit in FIG. 2B would be inserted in the path for the signal DOPCOUNT shown in FIG. 2A, and a similar circuit would be inserted in the path for the signal PCDONE to convert this signal formed in the adjustable-frequency oscillator time domain for use in the reference oscillator time domain.

Returning to FIG. 2A, the signal PCDONE, indicating completion of the prescaler count in the counter in circuit 220, is synchronized back into the REF_CLK domain, i.e., into the circuit 210, preferably using a circuit similar to the in FIG. 2B but clocked with the signal REF_CLK. When the signal DOPCOUNT from the circuit 210 goes high, a counter initialized to the value INIT, computed as described below in the REF_CLK domain, begins counting. The counter stops counting when the synchronized signal PCDONE goes high. This counter in the REF_CLK domain, which counts during the time window controlled by the circuit 220, is thus a measure of the frequency of the VCO using the reference oscillator 260 as a frequency reference. A signal UPDATE that indicates the frequency counter result is available pulses high when the final count of the frequency counter in the circuit 210 is available. When the count is finished, the signal DOPCOUNT is driven low by the circuit 210, resetting the PRE_CLK counter in the circuit 220. After synchronization delays, the signal PCDONE goes low in the circuit 220, and the frequency counter in the circuit 210 begins anew. When the control signal LDEN goes low, both counters are asynchronously reset.

The final value of the REF_CLK count, which is provided in the signal REF_COUNT on line 211, is $$\text{REF\_COUNT} = \frac{T_{PC}}{T_{REF}} + INIT + 1 + \epsilon_R \quad (2)$$

where $T_{PC}$ is given by equation (1), $T_{REF}$ is the period of the reference clock, INIT is the initial value for the counter for REF_COUNT as described below, and $\epsilon_R$ represents uncertainty in the synchronization process, where $$0 \leq \epsilon_R \leq 1.$$

The frequency counter in the circuit 210 is used to compute the number of unit capacitor cells to add or subtract in the VCO capacitor bank to adjust the VCO frequency. The period $T_{VCO}$ of the VCO when k unit cells are switched in can be estimated using the equation $$T_{VCO} = \frac{1}{f_0} \sqrt{1 + \rho_U(k - k_0)} \quad (3)$$

where $f_0$ is the VCO frequency when $k_0$ unit cells are switched in, and $\rho_U$ is the unit cell capacitance as a fraction of the total bank capacitance. For a desired VCO frequency $f_d$, the corresponding oscillator period is $$T_{REF}/M$$

from the definition of M. The desired number of unit cells, $k_d$, must satisfy the equation.

$$\frac{T_{REF}}{M} = \frac{1}{f_0} \sqrt{1 + \rho_U(k_d - k_0)}. \quad (4)$$

Combining equations (3) and (4), the VCO oscillation period $T_{VCO}$ can be computed from the equation $$T_{VCO} = \frac{T_{REF}}{M}\sqrt{1 - \frac{\rho_U \cdot \Delta k}{1 + \rho_U(k_d - k_0)}} \quad (5)$$

where $\Delta_k = k_d - k$, which is the change needed in the number of unit capacitor cells. If it is assumed that $\rho_U \ll 1$ then the VCO oscillation period is given approximately by the equation $$T_{VCO} = \frac{T_{REF}}{M}\left(1 - \frac{\rho_U \cdot \Delta k}{2}\right) \quad (6)$$

using a power-series approximation for the square root of a number close to unity.

The number STOP_COUNT to terminate the count in the counter circuit 220 is chosen from the equation $$\text{STOP\_COUNT} = \text{Round} \cdot \left(\frac{2^{N+1}}{\rho_U} - 2.5\right) \quad (7)$$

where the variable N is a positive integer, preferably a small positive constant such as the number 2. A good compromise for the integer N in practical applications appears to be the value N=2. The value to use for the integer N is a trade-off between measurement error and measurement time. Assuming $\epsilon_p$ and $\epsilon_R$ each average 0.5, then by combining equations (1), (2), (6), and (7), the value of REF_COUNT (the final value of the REF_COUNT count) is given approximately by the equation $$\text{REF\_COUNT} = \text{STOP\_COUNT} + \text{INIT} + 4 - 2^N \cdot \Delta_k. \quad (8)$$

If the value of INIT is set to $$\text{INIT} = \text{onescomplement}(\text{STOP\_COUNT} + 3 + 2^{N-1}) \quad (9)$$

where the operator "onescomplement" represents the onescomplement operator for the indicated variable, then it can be shown that $$\Delta_k = \text{onescomplement}(\text{REF\_COUNT} \gg N) \quad (10)$$

where ">>" is the right-shift operator.

The variable $\Delta_k$ is a twos-complement binary representation of the change needed in the number of unit capacitor cells coupled to the resonant tank circuit for the VCO. Using the number of unit capacitor cells $U_{k-1}$ presently coupled to the resonant tank circuit, the number of unit capacitor cells $U_k$ can be readily computed by numerical addition. The quantity $\Delta_k$ is added to the binary value $U_{k-1}$ presently controlling the switches in the in the bank of capacitors to obtain the corrected value $U_k$:

$$U_k = U_{k-1} + \Delta_k. \quad (11)$$

The process can be repeated if necessary to obtain a more precise value.

Figure 2C:
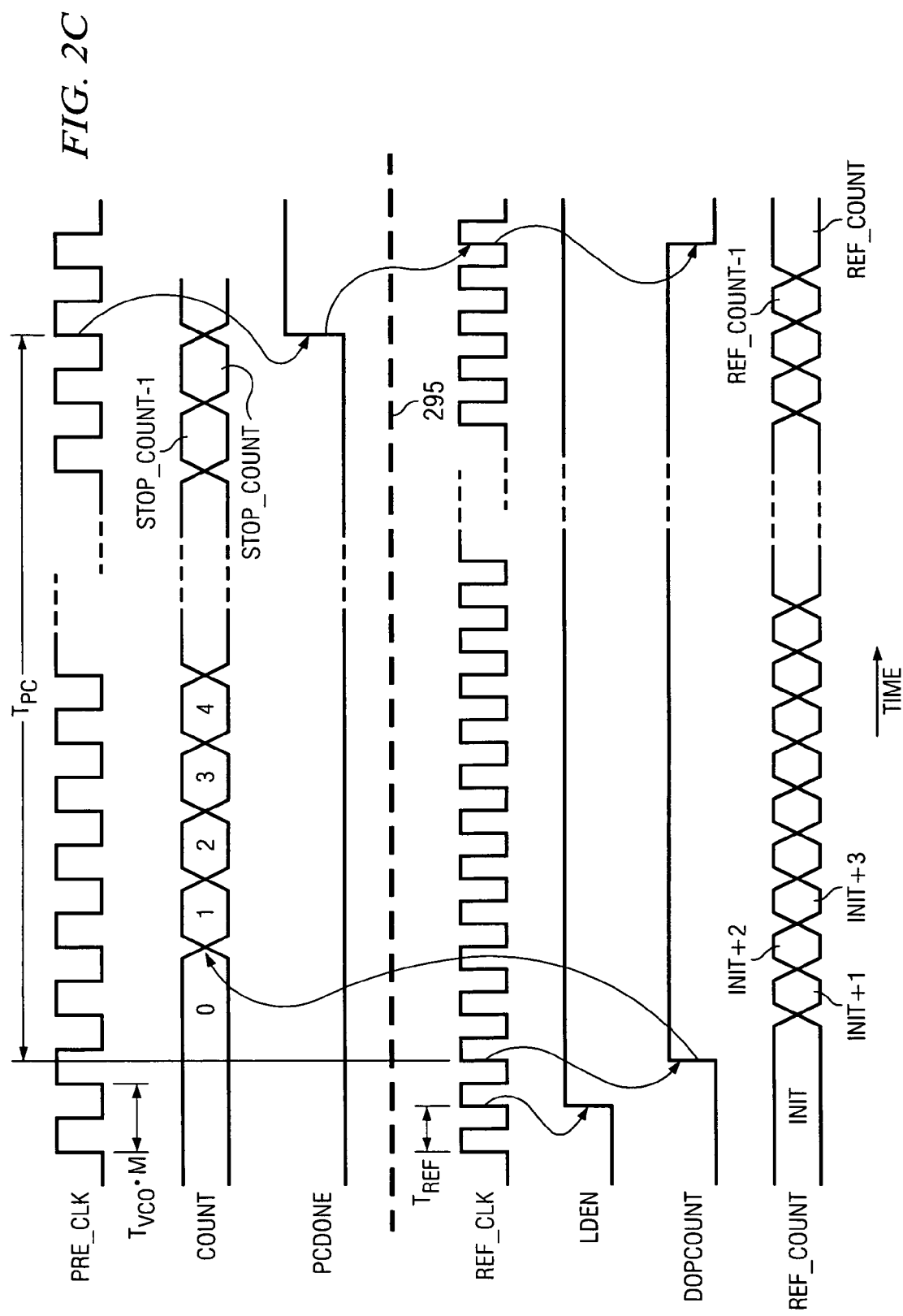
FIG. 2C illustrates a timing diagram for the reference and adjustable-frequency oscillators and the associated cycle counts.

FIG. 2C illustrates a timing diagram for signals in an embodiment of the invention, showing the signal PRE_CLK from the frequency divider output of the adjustable-frequency oscillator and the signal REF_CLK from the reference oscillator. The control signal LDEN is asserted high to initiate the process, followed by the signal DOPCOUNT being set high in the circuit 210. The counter in the circuit 220 counts from zero to the value STOP_COUNT, whereupon the signal PCDONE is set high. The counter in circuit 210 counts cycles of the reference oscillator from an initial value INIT to an ending value REF_COUNT. The value REF_COUNT is then used by the switch selector 250 (illustrated in FIG. 2A) to set the switch configuration of the switched capacitors for the VCO. The horizontal dashed line 295 separates the timing domain of the adjustable-frequency oscillator from the timing domain of the reference oscillator.

As an example of the binary value of $U_k$ controlling a bank of capacitors with five capacitors with capacitance values proportional to the integer-power-of-two sequence {1, 2, 4, 8, ... }, the value "01101" for $U_k$ would open the switch for the largest capacitor (corresponding to the first "0"), close the switches for the next smaller two capacitors (corresponding to "11"), open the switch for the next smaller capacitor, and close the switch for the smallest capacitor.

Thus, if the bank of capacitors is chosen with capacitance values proportional to the integer-power-of-two sequence {1, 2, 4, 8, ... }, then the capacitors coupled to the resonant tank circuit of the adjustable-frequency oscillator can be quickly and simply controlled with a digital process employing a twos-complement binary representation of the variable $\Delta_k$, which may represent positive and negative increments for switch settings. The setting of switches controlling capacitors coupled to the resonant tank circuit is performed using the variable $\Delta_k$ by the SWITCH SELECTOR circuit in block 250 FIG. 2A.

The voltage of the varactor diode can be used for a further adjustment to the oscillator frequency after selecting a switched-capacitor configuration, using circuits and processes well known in the art.

A laboratory circuit was constructed to adjust the frequency of a VCO using the method of the invention. In this circuit, two banks of capacitors are used to adjust the VCO frequency: a coarse tuning bank and a fine tuning bank. For the coarse tuning bank, $\rho_U = 0.04917$, and STOP_COUNT=160. For the fine tuning bank, $\rho_U = 0.006563$, and STOP_COUNT=1216. The capacitor tuning process in this circuit searches for the best capacitor value within each capacitor bank using a frequency counter as described hereinabove. The signal STOP_COUNT is set to a value, nominally 160 or 1216 for the coarse and fine banks, respectively. A step counter keeps track of the status of the process. At the start of the process, the step counter is set to zero and LDEN is set high. If the step counter is even, as it is in this application at the start of the process, the step counter is incremented. If the step counter is odd, the process waits for the signal UPDATE to be high. If the signal UPDATE is high, the number of unit capacitors is updated based on the value of REF_COUNT. The nominal change in the number of unit capacitors is onescomplement (REF_COUNT>>N). If no change is required in the number of unit capacitors, or if the step counter reaches a predetermined maximum count (such as the number 9 for the coarse bank), the tuning process is complete.

Figure 3:
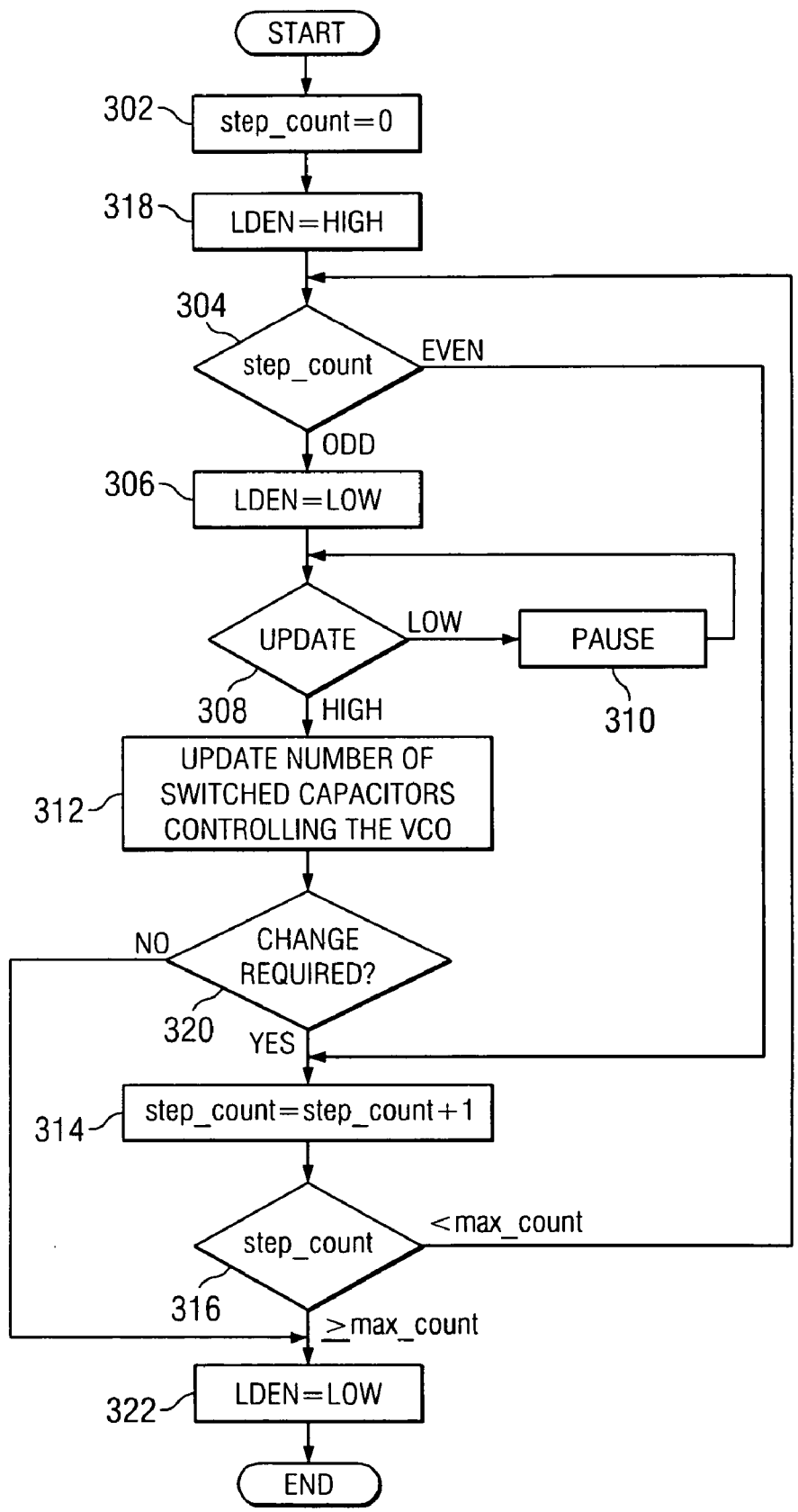
FIG. 3 illustrates a process to control the capacitor selection process of the invention.

A flowchart illustrating setting the signal LDEN and thereby controlling a process to update the switched capacitor settings is shown in FIG. 3. To begin the oscillator frequency adjusting process, a counter step_count is initialized to the value zero in block 302, and the control signal LDEN is set high in block 318. The counter step_count is tested in block 304, and if step_count is odd, the control signal LDEN is set low in block 306. The process pauses (controlled by blocks 308, 310) until the control signal UPDATE is set high. When the control signal UPDATE is set high, the switched capacitors controlling the VCO frequency are updated in block 312. If no further change in VCO frequency is required, as indicated in block 320, i.e., if the VCO frequency has been adjusted to the required value, the control signal LDEN is set low in block 322, and the VCO frequency-adjusting process is complete. Otherwise, the counter step_count is incremented in block 314. The maximum number of iterations of the process is controlled by the parameter max_count, which is tested in block 316. If the maximum number of iterations has not been reached, the process repeats, returning to block 304.

The adjustable-frequency oscillator frequency tuning method in an embodiment of the invention can be performed by a method that reverses the roles of the reference oscillator and the adjustable-frequency oscillator in the feedback circuit arrangement. An exemplary circuit diagram using the reversed the oscillator roles is illustrated in FIG. 4, wherein the reference oscillator is coupled to the circuit 420, and the divided frequency of the adjustable-frequency oscillator is coupled to the circuit 410, an arrangement opposite to that illustrated and described hereinabove with reference to FIG. 2A.

Figure 4:
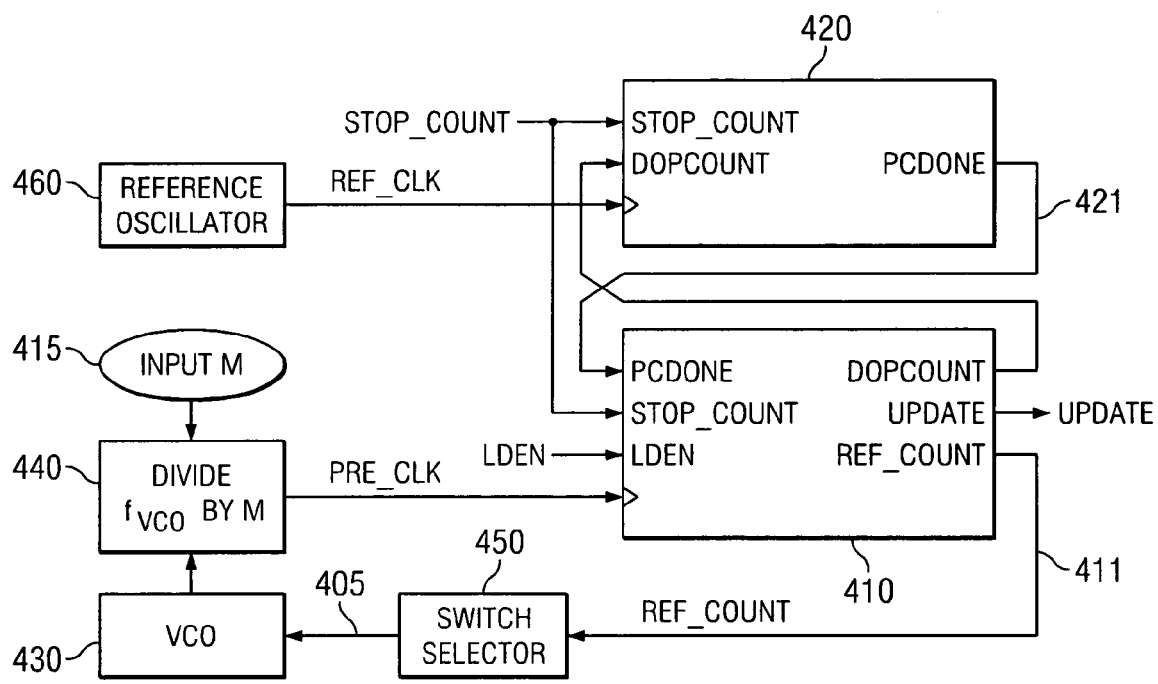
FIG. 4 illustrates a block diagram of the invention showing counters that control a switch selector circuit for an adjustable-frequency oscillator.

Several modifications to equations supporting the circuit illustrated in FIG. 2A are used for the reversed circuit arrangement illustrated in FIG. 4, particularly to equations (1), (2), (6), (8), and (10). In equation (1), replace $T_{VCO} \cdot M$ with $T_{REF}$. In equation (2), replace $T_{REF}$ with $T_{VCO} \cdot M$. In equation (6), multiply both sides by M, swap $T_{VCO} \cdot M$ and $T_{REF}$, and change the sign in front of the $\Delta_k$ term. In equation (8), change the sign of the $\Delta_k$ term. In equation (10), remove the ones-complement operator.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and utilization of techniques to form the processes and systems providing rapid frequency adjustment of an adjustable-frequency oscillator with simplified digital computation as described herein may be varied while remaining within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A control device to adjust a frequency of an adjustable-frequency oscillator, comprising:
   a first counter supplied with a stop-count value, the first counter coupled to the adjustable-frequency oscillator to count adjustable-frequency oscillator cycles divided by a frequency-dividing factor, wherein the first counter produces a stop signal when the first counter has counted a number of cycles of the adjustable-frequency oscillator equal to the stop-count;
   a reference oscillator;
   a second counter coupled to the first counter and to the reference oscillator to count reference oscillator cycles, wherein the second counter starts counting from an initial number at substantially the same time when the first counter starts counting and stops counting when the second counter receives the stop signal from the first counter to produce an end count in the second counter, the end count comprising a binary number;
   a resonant tank circuit coupled to the adjustable-frequency oscillator, the resonant tank circuit including a bank of capacitors and switches that are each coupled to a capacitor in the bank of capacitors, wherein the switches selectively couple capacitors in the bank of capacitors to the resonant tank circuit, and wherein capacitance of capacitors in the bank of capacitors form a sequence of capacitance substantially proportional to an integer-power-of-two sequence; and
   a switch selector circuit coupled to the switches in the resonant tank circuit to control the frequency of the adjustable-frequency oscillator, the switch selector circuit coupled to the second counter and to the switches in the resonant tank circuit, wherein the switch selector circuit controls the switches in the resonant tank circuit based on a ones complement of the binary number.

2. The control device according to claim 1, wherein the first counter, the second counter, and the switch selection circuit operate in an iterative process.

3. The control device according to claim 1, wherein the frequency-dividing factor is a desired frequency for the adjustable-frequency oscillator divided by a frequency of the reference oscillator.

4. The control device according to claim 1, wherein the capacitors are scaled to a unit cell capacitance and have a total bank capacitance, wherein the capacitances of the capacitors in the bank are proportional to a series of integer powers of 2, and wherein:
   an integer N is selected;
   the stop-count value is set to substantially 2.5 less than $2^{N+1}$ divided by the unit cell capacitance as a fraction of the total bank capacitance; and
   the initial number is substantially the stop-count value plus 3 plus $2^{N+1}$.

5. The control device according to claim 4, wherein integer N is selected to be equal to 2.

6. The control device according to claim 1, wherein the initial number is represented in twos-complement binary digits.

7. The control device according to claim 1, wherein the reference oscillator is a crystal-controlled oscillator.

8. A method of controlling a frequency of an adjustable-frequency oscillator, comprising:
   starting a first count of cycles of the adjustable-frequency oscillator divided by a frequency-dividing factor which is a ratio of a desired frequency for the adjustable-frequency oscillator to a frequency of a reference oscillator;
   stopping the first count when the first count reaches a stop-count value;
   counting cycles of the reference oscillator to produce a second count, starting the second count with an initial number at substantially a same time when the first count is started, and stopping the second count to produce an end count when the first count is stopped to create a binary value;
   processing the binary value into a binary number indicative of capacitors in a bank of capacitors in a resonant tank circuit to be used to form a desired total capacitance, and selectively coupling the capacitors in the bank of capacitors to the resonant tank circuit in accordance with the binary number to control the frequency of the adjustable-frequency oscillator.

9. The method according to claim 8, further including using a crystal-controlled oscillator for the reference oscillator.

10. A method of controlling a frequency of an adjustable-frequency oscillator, comprising:

starting a first count of cycles of the adjustable-frequency oscillator divided by a frequency-dividing factor which is a ratio of a desired frequency for the adjustable-frequency oscillator to a frequency of a reference oscillator;

supplying a stop-count value and stopping the first count when the first count reaches the stop-count value;

counting cycles of the reference oscillator to produce a second count, starting the second count with an initial number at substantially a time when the first count is started, and stopping the second count to produce an end count when the first count is stopped;

coupling a resonant tank circuit to the adjustable-frequency oscillator, including a bank of capacitors in the resonant tank circuit with switches that are each coupled to a capacitor in the bank of capacitors, selecting capacitance of capacitors in the bank of capacitors to form a sequence of capacitance substantially proportional to an integer-power-of two sequence, and selectively coupling capacitors in the bank of capacitors to the resonant tank circuit with the switches;

controlling the frequency of the adjustable-frequency oscillator using the end count to control the switches; and forming the bank of capacitors using capacitors with a unit cell capacitance and the bank having a total bank capacitance, and choosing capacitance values for the capacitors in the bank of capacitors proportional to a series of integer powers of 2;

selecting an integer N;

setting the stop-count value for the first count to be substantially 2.5 less than $2^{N+1}$ divided by the unit cell capacitance as a fraction of the total bank capacitance, and starting the first count at the value zero; and using substantially the stop-count value plus 3 plus $2^{N-1}$ for the initial number.

11. The method according to claim 10, further including representing the initial number using twos-complement binary digits.

12. The method according to claim 10, further including selecting the integer N to be equal to 2.

13. A control device to adjust a frequency of an adjustable-frequency oscillator, comprising:

a reference oscillator;

a first counter supplied with a stop-count value, the first counter coupled to the reference oscillator to count reference oscillator cycles, wherein the first counter produces a stop signal when the first counter has counted a number of cycles of the reference oscillator equal to the stop-count value;

a second counter coupled to the first counter and to the adjustable-frequency oscillator to count adjustable-frequency oscillator cycles using a frequency dividing circuit, wherein the adjustable-frequency oscillator cycles are divided by a frequency-dividing factor which is a ratio of a desired frequency for the adjustable-frequency oscillator to a frequency of the reference oscillator, wherein the second counter starts counting from an initial number at substantially a same time when the first counter starts counting and stops counting when the second counter receives the stop signal from the first counter, to produce an end count in the second counter;

a resonant tank circuit coupled to the adjustable-frequency oscillator, the resonant tank circuit including a bank of capacitors and switches, each of the switches being coupled to a respective capacitor in the bank of capacitors, wherein the switches selectively couple respective ones of the capacitors in the bank of capacitors to the resonant tank circuit, and wherein the capacitors in the bank of capacitors form a sequence of capacitance substantially proportional to an integer-power-of two sequence; and a switch selector circuit coupled to the switches in the resonant tank circuit to control the frequency of the adjustable-frequency oscillator, the switch selector circuit coupled to the second counter and to the switches in the resonant tank circuit, wherein the switch selector circuit controls the switches in the resonant tank circuit based on the end count, and wherein the switch selector converts the end count into a binary value, wherein each bit in the binary value represents a state of a respective one of the switches.

14. The adjustable-frequency oscillator according to claim 13, wherein the first counter, the second counter, and the switch selection circuit operate in an iterative manner.

* * * * *